(12) United States Patent
Poblenz et al.

(10) Patent No.: US 8,252,662 B1
(45) Date of Patent: Aug. 28, 2012

(54) METHOD AND STRUCTURE FOR MANUFACTURE OF LIGHT EMITTING DIODE DEVICES USING BULK GAN

(75) Inventors: Christiane Poblenz, Goleta, CA (US);
Mathew C. Schmidt, Goleta, CA (US);
Daniel F. Feezell, Goleta, CA (US);
James W. Raring, Goleta, CA (US);
Rajat Sharma, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/749,476

(22) Filed: Mar. 29, 2010

Related U.S. Application Data

(60) Provisional application No. 61/164,407, filed on Mar. 28, 2009.

(51) Int. Cl.
*H01L 21/30* (2006.01)
(52) U.S. Cl. ......... 438/458; 257/E21.108; 257/E21.117; 257/E21.214; 257/E21.22; 257/E21.365; 257/E21.393; 257/E21.398; 257/E21.697; 438/29; 438/33; 438/46; 438/460; 438/604; 438/637
(58) Field of Classification Search ........... 257/E21.108, 257/E21.117, E21.214, E21.22, E21.365, 257/E21.393, E21.398, E21.697; 438/29, 438/33, 46, 458, 460, 604, 637
See application file for complete search history.

(56) References Cited

U.S. PATENT DOCUMENTS

| | | | |
|---|---|---|---|
| 5,334,277 A | 8/1994 | Nakamura | |
| 5,696,389 A | 12/1997 | Ishikawa et al. | |
| 6,147,953 A | 11/2000 | Duncan | |
| 6,858,081 B2 | 2/2005 | Biwa et al. | |
| 6,920,166 B2 | 7/2005 | Akasaka et al. | |
| 7,053,413 B2 | 5/2006 | D'Evelyn et al. | |
| 7,063,741 B2 | 6/2006 | D'Evelyn | |
| 7,198,671 B2 | 4/2007 | Ueda | |
| 7,211,833 B2 | 5/2007 | Slater, Jr. et al. | |
| 7,220,324 B2 | 5/2007 | Baker et al. | |
| 7,323,723 B2 | 1/2008 | Ohtsuka et al. | |
| 7,338,828 B2 | 3/2008 | Imer et al. | |
| 7,727,332 B2 | 6/2010 | Habel et al. | |
| 8,048,225 B2 | 11/2011 | Poblenz et al. | |

(Continued)

OTHER PUBLICATIONS

D'Evelyn et al., "Bulk GaN Crystal Growth by the High-Pressure Ammonothermal Method," Journal of Crystal Growth, 2007, vol. 300, pp. 11-16.

(Continued)

*Primary Examiner* — Asok Sarkar
(74) *Attorney, Agent, or Firm* — Kilpatrick Townsend & Stockton LLP

(57) ABSTRACT

A method for manufacturing a plurality light emitting diodes includes providing a gallium nitride containing bulk crystalline substrate material configured in a non-polar or semi-polar crystallographic orientation, forming an etch stop layer, forming an n-type layer overlying the etch stop layer, forming an active region, a p-type layer, and forming a metallization. The method includes removing a thickness of material from the backside of the bulk gallium nitride containing substrate material. A plurality of individual LED devices are formed from at least a sandwich structure comprising portions of the metallization layer, the p-type layer, active layer, and the n-type layer. The LED devices are joined to a carrier structure. The method also includes subjecting the gallium nitride containing bulk crystalline substrate material to at least one etching process to selectively remove crystalline material underlying the etch stop layer, wherein the etch stop layer is exposed, and the etch stop layer remains substantially intact.

18 Claims, 5 Drawing Sheets

U.S. PATENT DOCUMENTS

| | | | |
|---|---|---|---|
| 2002/0050488 A1 | 5/2002 | Nikitin et al. | |
| 2003/0140846 A1 | 7/2003 | Biwa et al. | |
| 2004/0060518 A1 | 4/2004 | Nakamura et al. | |
| 2004/0196877 A1 | 10/2004 | Kawakami et al. | |
| 2005/0168564 A1 | 8/2005 | Kawaguchi et al. | |
| 2005/0224826 A1 | 10/2005 | Keuper et al. | |
| 2006/0037529 A1 | 2/2006 | D'Evelyn | |
| 2006/0079082 A1* | 4/2006 | Bruhns et al. | 438/637 |
| 2006/0118799 A1 | 6/2006 | D'Evelyn et al. | |
| 2006/0189098 A1* | 8/2006 | Edmond | 438/460 |
| 2006/0256482 A1 | 11/2006 | Araki et al. | |
| 2007/0218703 A1 | 9/2007 | Kaeding et al. | |
| 2008/0087919 A1 | 4/2008 | Tysoe et al. | |
| 2008/0092812 A1 | 4/2008 | McDiarmid et al. | |
| 2008/0124817 A1 | 5/2008 | Bour et al. | |
| 2008/0173735 A1 | 7/2008 | Mitrovic et al. | |
| 2008/0191223 A1 | 8/2008 | Nakamura et al. | |
| 2008/0303033 A1* | 12/2008 | Brandes | 257/76 |
| 2009/0078944 A1 | 3/2009 | Kubota et al. | |
| 2009/0081857 A1* | 3/2009 | Hanser et al. | 438/507 |
| 2009/0159869 A1 | 6/2009 | Ponce et al. | |
| 2009/0250686 A1 | 10/2009 | Sato et al. | |
| 2009/0267100 A1 | 10/2009 | Miyake et al. | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0309127 A1 | 12/2009 | Raring et al. | |
| 2009/0320744 A1 | 12/2009 | D'Evelyn | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031875 A1 | 2/2010 | D'Evelyn | |
| 2010/0096615 A1 | 4/2010 | Okamoto et al. | |
| 2010/0140745 A1 | 6/2010 | Khan et al. | |
| 2010/0151194 A1 | 6/2010 | D'Evelyn | |
| 2010/0295054 A1 | 11/2010 | Okamoto et al. | |
| 2010/0316075 A1 | 12/2010 | Raring et al. | |
| 2011/0057167 A1 | 3/2011 | Ueno et al. | |
| 2011/0064100 A1 | 3/2011 | Raring et al. | |
| 2011/0064101 A1 | 3/2011 | Raring et al. | |
| 2011/0064102 A1 | 3/2011 | Raring et al. | |
| 2011/0103418 A1 | 5/2011 | Hardy et al. | |
| 2011/0186874 A1 | 8/2011 | Shum | |
| 2011/0186887 A1 | 8/2011 | Trottier et al. | |

OTHER PUBLICATIONS

Fujii et al., "Increase in the Extraction Efficiency of GaN-based Light-Emitting Diodes Via Surface Roughening," 2004, Applied Physics Letters, vol. 84, No. 6, pp. 855-857.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Shchekin et al., "High Performance Thin-film Flip-Chip InGaN-GaN Light-emitting Diodes," 2006, Applied Physics Letters, vol. 89, pp. 071109-071109-3.

Schmidt et al., "High Power and High External Efficiency m-plane InGaN Light Emitting Diodes," 2007, Japanese Journal of Applied Physics, vol. 46, No. 7, pp. L126-L128.

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Wierer et al., "High-power AlGaInN Flip-chip Light-emitting Diodes," 2001, Applied Physics Letters, vol. 78, No. 22, pp. 3379-3381.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

U.S. Appl. No. 12/749,476, filed Jul. 2, 2009, Raring et al.

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Gardner et al. "Blue-emitting InGaN-GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Purvis, "Changing the Crystal Face of Gallium Nitride." The Advance Semiconductor Magazine, vol. 18, No. 8, Nov. 2005.

Schmidt et al., "Demonstration of Nonpolar m-plane InGaN/GaN Laser Diodes," 2007, Journal of Japanese Applied Physics, vol. 46, No. 9, pp. 190-191.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et. al. Dislocation related issues in the degradation of GaN-based laser diodes, IEEE Journal of Selected Topics in Quantum Electronics vol. 10, No. 6 (2004).

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

http://techon.nikkeibp.co jp/english/NEWS_EN/20080122/146009/?ST=english_PRINT Jan. 6, 2010.

Amano et al., 'Metalorganic Vapor Phase Epitaxial Growth Of A High Quality GaN Film Using An AIN Buffer Layer,' Applied Physics Letter, vol. 48, No. 5, 1986, pp. 353-355.

Baker et al., 'Characterization Of Planar Semipolar Gallium Nitride Films On Spinel Substrates,' Japanese Journal of Applied Physics, vol. 44, No. 29, 2005, pp. L920-L922.

Baker et al., 'Characterization Of Planar Semipolar Gallium Nitride Films On Spinel Substrates,' Japanese Journal of Applied Physics, vol. 44, No. 29, 2005, pp. L154-L157.

Cantu et al., 'Si Doping Effect On Strain Reduction In Compressively Strained AI0.49Ga0.51N Thin Films,' Applied Physics Letter, vol. 83, No. 4, 2003, pp. 674-676.

Chakraborty et al., 'Defect Reduction In Nonpolar a-Plane GaN Films Using in situ SiNx Nanomask,' Applied Physics Letters, vol. 89, 2006, pp. 041903-1-041903-3.

Corrion et al., 'Structural And Morphological Properties Of GaN Buffer Layers Grown By Ammonia Molecular Beam Epitaxy On SiC Substrates For AIGaN/GaN High Electron Mobility Transistors,' Journal of Applied Physics, vol. 103, No. 9, 2008, pp. 093529-1-093529-7.

Davidsson et al., 'Effect Of AIN Nucleation Layer On The Structural Properties Of Bulk GaN Grown On Sapphire By Molecular-Beam Epitaxy,' Journal of Applied Physics, vol. 98, No. 1, 2005, pp. 016109-1-016109-3.

Grandjean et al., 'Nitridation Of Sapphire. Effect On The Optical Properties Of GaN Epitaxial Overlayers,' Applied Physics Letters, vol. 69, No. 14, 1996, pp. 2071-2073.

Green et al., 'Polarity Control During Molecular Beam Epitaxy Growth of Mg-Doped GaN,' Journal of Vacuum Science Technology, vol. B-21, No. 4, 2003, pp. 1804-1811.

Hellman, 'The Polarity Of GaN: A Critical Review,' MRS Internet Journal Nitride Semiconductor Research, vol. 3, No. 11, 1998, pp. 1-11.

Heying et al., 'Control Of GaN Surface Morphologies Using Plasma-Assisted Molecular Beam Epitaxy,' Journal of Applied Physics, vol. 88, No. 4, 2000, pp. 1855-1860.

Katona et al., 'Observation Of Crystallographic Wing Tilt In Cantilever Epitaxy of GaN On Silicon Carbide And Silicon (111) Substrates,' Applied Physics Letters, vol. 79, No. 18, 2001, pp. 2907-2909.

Keller et al., 'Influence Of Sapphire Nitridation On Properties Of Gallium Nitride Grown By Metalorganic Chemical Vapor Deposition,' Applied Physics Letters, vol. 68, No. 11, 1996, pp. 1525-1527.

Keller et al., 'Influence Of The Substrate Misorientation On The Properties Of N-Polar GaN Films Grown By Metal Organic Chemical Vapor Deposition,' Journal of Applied Physics, vol. 102, 2007, pp. 083546-1-083546-6.

Koblmuller et al., 'In Situ Investigation Of Growth Modes During Plasma-Assisted Molecular Beam Epitaxy Of (0001) GaN,' Applied Physics Letters, vol. 91, 2007, pp. 161904-1-161904-3.

Koblmuller et al., 'High Electron Mobility GaN Grown Under N-Rich Conditions By Plasma-Assisted Molecular Beam Epitaxy,' Applied Physics Letters, vol. 91, 2007, pp. 221905-1-221905-3.

Manfra et al., 'Dislocation And Morphology Control During Molecular-Beam Epitaxy Of AIGaN/GaN Heterostructures Directly On Sapphire Substrates,' Applied Physics Letters, vol. 81, No. 8, 2002, pp. 1456-1458.

Marchand et al., 'Microscructure Of GaN Laterally Overgrown By Metalorganic Chemical Vapor Deposition,' Applied Physics Letters, vol. 73, No. 6, 1998, pp. 747-749.

Nakamura et al., 'GaN Growth Using GaN Buffer Layer,' Japanese Journal of Applied Physics, vol. 30, No. 10A, 1991, pp. L1705-L1707.

Park et al., 'Selective-Area And Lateral Epitaxial Overgrowth Of III-N Materials By Metal Organic Chemical Vapor Deposition,' Applied Physics Letters, vol. 73, No. 3, 1998, pp. 333-335.

International Search Report & Written Opinion of PCT Application No. PCT/US2009/056546, dated Nov. 2, 2009, 9 pages total.

Romanov et al., 'Stress Relaxation In Mismatched Layers Due To Threading Dislocation Inclination,' Applied Physics Letter, vol. 83, No. 13, 2003, pp. 2569-2571.

Stutzmann et al., 'Playing With Polarity,' Physics Status Solidi, vol. 228, No. 2, 2001, pp. 505-512.

Sumiya et al., 'Growth Mode And Surface Morphology Of A GaN Film Deposited Along The N-Face Polar Direction On c-Plane Sapphire Substrate,' Journal of Applied Physics, vol. 88, No. 2, 2000, pp. 1158-1165.

Sumiya et al., 'Review Of Polarity Determination And Control Of GaN,' MRS Internet Journal Nitride Semiconductor Research, vol. 9, No. 1, 2004, pp. 1-34.

Waltereit et al., 'Structural Properties Of GaN Buffer Layers On 4H-SiC(0001) Grown By Plasma-Assisted Molecular Beam Epitaxy For High Electron Mobilty Transistors,' Japanese Journal of Applied Physics, vol. 43, No. 12-A, 2004, pp. L1520-L1523.

Weyher et al., 'Morphological and Structural Characteristics of Homoepitaxial GaN Grown by Metalorganic Chemical Vapour Deposition (MOCVD),' Journal of Crystal Growth, vol. 204, 1999, pp. 419-428.

Xu et al., 'Polarity Control Of GaN Grown On Sapphire Substrate By RF-MBE,' Journal of Crystal Growth, vol. 237-239, Pt. 2, 2002, pp. 1003-1007.

* cited by examiner

METHOD AND STRUCTURE FOR MANUFACTURE OF LIGHT EMITTING DIODE DEVICES USING BULK GAN

CROSS-REFERENCES TO RELATED APPLICATIONS

This application claims priority to U.S. Provisional Application No. 61/164,407 filed Mar. 28, 2009, commonly assigned, and incorporated by reference in its entirety for all purpose herein.

BACKGROUND OF THE INVENTION

Gallium nitride (GaN) based solid-state lighting technologies have made advances in the past three decades and promise to replace traditional fluorescent and incandescent bulbs for general illumination at tremendous energy and cost savings. GaN-based high-brightness light-emitting diodes (LEDs) have already penetrated various markets such as displays, traffic signals, cell phone backlights, and automotive lighting, and white LEDs have presence in various niche lighting markets. The efficiencies of such commercially available white LEDs have surpassed that of incandescent lighting and are now competitive with that of fluorescent lamps (~70-100 lumens per Watt (lm/W)). However, the performance of individual LED components still falls short of what is required to enable a ubiquitous general illumination solution. A source efficiency of 150 lm/W surpasses the majority of traditional lighting technologies, and a white light source with this efficiency is widely considered to be a viable replacement for conventional light sources. Thus, significant improvements are still required, and improving the efficiency of GaN-based LEDs for such applications remains the subject of vigorous research efforts.

There are two main components to the overall efficiency of an LED: the internal quantum efficiency (IQE) and the external quantum efficiency (EQE). IQE is related to the efficiency of the epitaxial device structure itself. EQE is the product of IQE and what is known as the extraction efficiency, and represents the total light out of a packaged device. Improved extraction efficiency (and, consequently, improved EQE) has become an important aspect of conventional LED manufacturing, in particular because there are limitations to the IQE which can be achieved in conventional devices.

One limiting factor is a result of the polar c-plane crystallographic orientation of conventional GaN-based devices. Strong internal electric fields are present in this direction which are well-known to reduce radiative recombination efficiency in optical devices due to spatial separation of electron and hole wave functions. One method to eliminate such effects is to grow on alternate orientations of GaN (for example orientations commonly known as "nonpolar" or "semipolar") in which such internal electric fields are either absent or greatly reduced. Several recent device demonstrations in various nonpolar and semipolar orientations[i,ii] have validated this approach for reducing internal fields and increasing IQE in LEDs.

Additionally limiting the IQE of conventional devices is the extremely high dislocation densities which arise from the use of foreign substrates such as (0001) sapphire or (0001) silicon carbide to grow GaN-based materials, a process commonly known as "heteroepitaxy". Heteroepitaxy results in GaN films with extremely high extended defect densities (e.g. threading dislocation (TD) densities of $\sim 10^9$-$10^{10}$ cm$^{-2}$). TDs in GaN are widely recognized to act as nonradiative recombination centers, thus reducing the internal quantum efficiency of heteroepitaxial devices. TDs can also provide significant leakage paths in diodes. The presence of basal plane stacking faults (which are much more prevalent in heteroepitaxy of nonpolar orientations of GaN) can also promote faceting, particularly during the growth of the active region of LEDs.

While improved growth techniques such as lateral epitaxial overgrowth (LEO) have been successful at reducing overall TD densities in polar and nonpolar GaN films, and have resulted in modest improvement in device performance in recent years, these approaches are processing-intensive and cost-prohibitive for LEDs. The most promising approach is to grow on high-quality native bulk-GaN substrates, thus mitigating dislocation generation due to heteroepitaxy. While there remains an extremely limited supply of bulk-GaN material and in particular cost-effective material suitable for use as a substrate, bulk-GaN material can be obtained. For example, pseudo-bulk-GaN material can be obtained by slicing the desired material orientation from a thick GaN sample grown heteroepitaxially (for example by hydride vapor phase epitaxy) and promising device demonstrations on such material have been shown in the literature.[iii,iv,v,vi,vii] Certain progress has also been made in the area of bulk-GaN synthesis by ammonothermal techniques as described in, for example[viii] M. P. D'Evelyn, H. C. Hong, D.-S. Park, H. Lu, E. Kaminsky, R. R. Melkote, P. Perlin, M. Leszczynski, S. Porowski, R. J. Molnar, "Bulk GaN crystal growth by the high-pressure ammonothermal method", Journal of Crystal Growth 300, 11-16 (2007).

It can be recognized from the above discussion that there are limitations to the IQE achievable in conventional GaN-based devices, and in particular LEDs, which can be significantly improved or overcome with the use of bulk-GaN substrates. However, as bulk-GaN technology is in its infancy, conventional LED manufacturing continues to employ heteroepitaxially grown structures. Therefore improvements in extraction efficiency have been made which can mitigate loss due to absorption in the substrate or contacts, bond pads, wire bonds, among other sources of loss. Dramatic improvements in conventional heteroepitaxial devices have been realized in recent years from several industry leaders by implementing LED devices and geometries known as "high-extraction" structures. An example of such a structure aimed at high extraction efficiency was shown in the literature by Fuji et al., and the representative schematic is shown in FIG. 1.[ix]

A main component of such high-extraction structures is the inverted orientation. The device is flipped over and mounted to a submount such that light extraction occurs through the backside, or n-doped side, of the LED. Also of significance is the short optical cavity length. For conventional heteroepitaxial LEDs in this type of configuration, a short optical cavity length can be achieved by separating the thin GaN epilayer from the non-native substrate using a method such as laser lift-off (in the case of sapphire), or dry- or wet-etching (in the case of SiC). These methods rely on a difference in either a physical property (band-gap) or chemical property (reactivity) to effect a separation at the substrate/epilayer heterointerface. During a sapphire laser lift-off process, a high-power laser beam (with a characteristic energy lower than the bandgap energy of the sapphire and higher than the bandgap energy of GaN) is directed at the GaN/sapphire interface through the optically transparent sapphire substrate. The laser energy induces the decomposition of the highly defective GaN at the GaN/sapphire interface into elemental nitrogen and gallium, resulting in spontaneous separation of the substrate and the epilayer. In the case of LEDs on SiC, there exist etch chemistries with sufficiently high etch rates as well as good etch selectivity (between SiC and GaN) to enable effective removal of the SiC substrate. For LEDs on bulk-GaN, however, the substrate and epilayer have substantially the same physical and chemical properties. Thus, effecting a separation based on the conventional methodologies just described is not possible.

As for the background, the benefits of such a high-extraction LED device structure and geometry for conventional heteroepitaxial LED devices can be known from the literature. For example, Philips Lumileds Lighting has reported that heteroepitaxial devices which include a short optical cavity length LED device and a roughened extraction surface exhibit superior performance relative to heteroepitaxial devices which emit light through a sapphire substrate.[x] Such results are shown in FIG. 2 (reproduced from Ref 11) in which the LEDs being compared were implemented into YAG:Ce phosphor-coated white LED lamps. The lamp performance is plotted in terms of luminous efficiency (lumens per Watt, lm/W) and flux (lumens). It can be seen that the light output of the thin-film flip-chip LED-based lamp is ~45% higher than that of the conventional flip-chip LED-based lamp over the entire range of current shown.

From the above, it can be seen that the use of bulk-GaN substrates is highly desired in order to improve upon the efficiency, in particular the IQE, of GaN-based devices. Additionally, device structures and geometries which are aimed at high-extraction are necessary and currently utilized in the industry for improved EQE in GaN-based devices.

BRIEF SUMMARY OF THE INVENTION

Techniques and methods that are applied to commercial heteroepitaxial LEDs (grown on non-native substrate materials) to achieve high extraction efficiencies are either largely unavailable or inapplicable without considerable modification in the case of LEDs on bulk-GaN substrates, or substrates which substantially comprise at least one of GaN, AlN, or InN materials. The many benefits of utilizing such bulk-GaN substrates necessitate chip and package designs aimed at high extraction efficiency such that as the technology advances it can be readily implemented into a manufacturing process. In one or more embodiments, the present invention includes a structure and fabrication method for full-scale commercialization of bulk-GaN-based LEDs.

According to the present invention, techniques for manufacture of semiconductor devices utilizing crystalline materials are described. More particularly, the present invention provides a structure and method using selective etching of crystalline materials. In particular, the method includes providing a crystalline substrate material containing at least one of GaN, AlN, or InN, for example. In a specific embodiment, the structure includes epitaxial layers which comprise the active layers of a light-emitting diode (LED) device. In a specific embodiment, the method includes use of a vertical selective etch to enable a short optical cavity length. In another specific embodiment, a lateral selective etch is utilized to enable a short optical cavity length device. Merely by way of example, the present materials and devices can be used in solid-state white lighting solutions which are based on LEDs.

In LEDs fabricated on bulk crystalline substrate material containing at least one of GaN, AlN or InN, for example, the substrate and epilayer have physical and chemical properties which are substantially the same. Thus, effecting a separation based on conventional methodologies previously described is not possible in order to enable a short optical cavity length. Rather, a method for transitioning from the epilayer-plus-substrate thickness of crystalline material to merely a thin epilayer of crystalline material is necessary. The present invention provides such a method and structure, in particular for crystalline substrate materials containing at least one of GaN, AlN, or InN.

One or more benefits may be achieved in the specific embodiments. In particular, the use of a short optical cavity length will minimize re-absorption of emitted light in LEDs. This is important for devices on state-of-the-art crystalline substrate materials containing at least one of GaN, AlN or InN, as depending on the growth method utilized to fabricate the crystalline substrate material (for example hydride vapor phase epitaxy or ammonothermal growth, among others), impurity levels can remain substantially high. This leads to crystalline materials which are not perfectly optically transparent, thus minimizing the thickness of this material through which light is emitted is advantageous. As shown in FIG. 2, enhanced performance has been demonstrated for conventional heteroepitaxial devices employing a short optical cavity length as compared to devices emitting through a sapphire substrate. In the case of an LED device fabricated on bulk crystalline substrate material containing at least one of GaN, AlN, or InN, this effect could be even more significant due to higher absorption properties in the bulk crystalline material as opposed to low-impurity substrates such as sapphire.

In a specific embodiment, the method includes providing a bulk crystalline substrate material containing at least one of GaN, AlN, or InN. The method includes deposition of a sacrificial layer containing at least one of GaN, AlN, or InN. In a specific embodiment the sacrificial layer serves as an etch stop layer. In a specific embodiment the method includes one or more thinning steps which transition the crystalline substrate material from a first thickness to an intermediate thickness by a mechanical, chemical, or physical technique, or a combination of such techniques. For example, this can be accomplished using techniques such as lapping, polishing, etching, or a combination of such techniques, among others. In a specific embodiment, the sacrificial layer remains intact. In a specific embodiment, individual devices are then singulated by a die-singulation process commonly known in the art, and the sample is re-oriented and attached to a secondary substrate such that the crystalline substrate material is exposed. In a specific embodiment, a further thinning step such as a vertical selective etch is utilized to remove the intermediate thickness of crystalline substrate material and stopping at the sacrificial etch stop layer.

In an alternative specific embodiment, the method includes providing a crystalline substrate material containing at least one of GaN, AlN, or InN. The method includes deposition of a sacrificial layer containing at least one of GaN, AlN, or InN. In a specific embodiment, the method includes definition of individual device mesas using a one or more standard processing steps and techniques known in the art. In a specific embodiment, the method includes deposition of an encapsulation layer over exposed sidewalls not including the sacrificial layer. In a specific embodiment, a lateral selective etch is utilized to etch the sacrificial layer while leaving the crystalline substrate material and encapsulant material substantially intact. In a specific embodiment this process effects a separation of the crystalline substrate material and the epitaxially grown layers above the sacrificial layer which include device layers.

One or more benefits can be achieved by utilizing this alternative method and structure, in particular the fact that this method is not destructive to the substrate. This is of importance given that the current cost of bulk crystalline substrate material containing at least one of GaN, AlN, or InN is significantly prohibitive to any near-term industry adoption of LED technology based on such bulk crystalline substrates. It is anticipated that cost savings would be realized if a method and process flow were developed which allowed the crystalline substrate material to remain intact. Conceivably re-use or multiple uses of the same crystalline substrate material would be possible after appropriate re-finishing in one or more embodiments.

In one or more preferred embodiments, the orientation of the crystalline substrate material containing at least one of GaN, AlN, or InN, is nonpolar or semipolar. There are one or more substantial benefits which can be realized using the novel orientations in these embodiments, in particular due to the reduction or absence of internal electric fields in the device. For example, this allows for increased radiative recombination efficiencies, and therefore higher IQE in devices in these orientations. Devices in these orientations also allow for use of thicker quantum wells in the active region without a performance trade-off due to internal fields. Additional benefits in these orientations include the potential for increased indium incorporation,[xi] and therefore the potential for light emission at longer wavelengths than conventional GaN-based devices, and potentially across the entire visible spectrum. Additionally, benefits include improved carrier distribution due to a predicted lower hole effective mass,[xii,xiii] the potential for higher hole concentrations in p-type material,[xiv] improved temperature stability, and potential for highly polarized light emission, among other benefits. Promising device demonstrations, in particular out of research groups at the University of California at Santa Barbara (i.e. References 1-8), have validated one or more of these potential benefits of devices on various nonpolar and semipolar orientations of GaN.

DETAILED DESCRIPTION OF THE INVENTION

In one or more specific embodiments, the present invention provides a variety of different process configurations and structures, with a desire of developing a robust, high-extraction-efficiency LED platform designed specifically around high-internal quantum efficiency (IQE) LED devices on bulk-GaN substrates. As previously discussed, the primary technical challenge in implementing existing high-extraction device configurations using bulk-GaN substrates or related bulk nitride-containing substrates, is transitioning from the epilayer-plus-substrate thickness of crystalline material to a reduced thickness of crystalline material (just 3-4 um or 200 nm to 5 micrometers) according to a specific embodiment). In a specific embodiment, a surface texturing step can be added to the present method and structure to increase light extraction efficiency.

Figure 2:
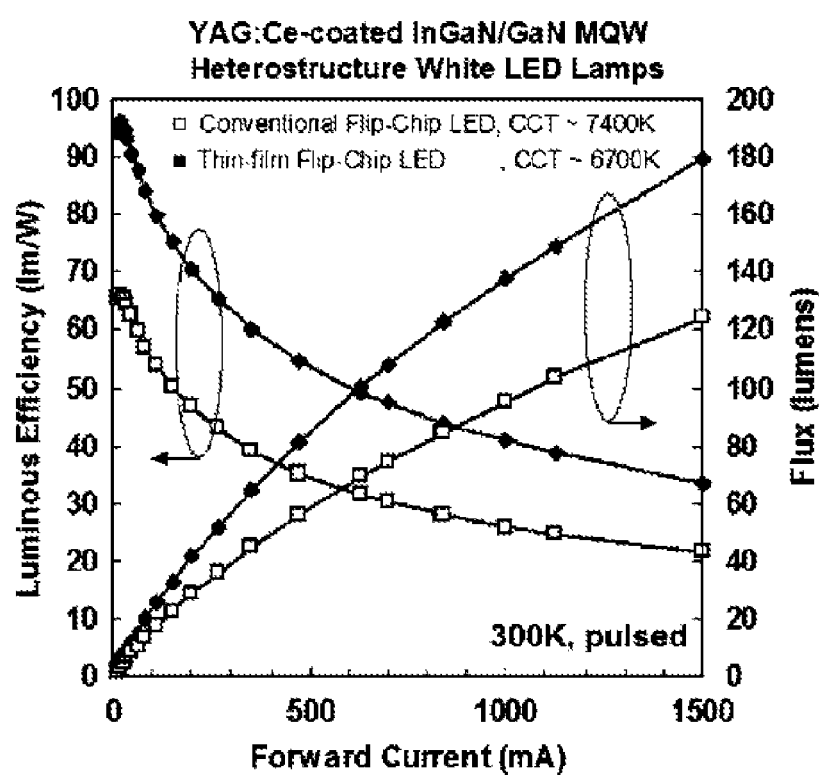
FIG. 2 is a simplified plot comparing light output and luminous efficiency as a function of current for white LED lamps based on YAG:Ce (phosphor) coated conventional flip chip and thin-film flip chip LEDs. As show, a total lumen output of the thin-film flip chip LED lamp exceeds that of the conventional flip chip by about 45%.

FIG. 2 is a simplified plot of light output and luminous efficiency vs. current comparisons between white LED lamps based on YAG:Ce (phosphor) coated conventional flip-chip and thin-film flip-chip LEDs. The total lumen output of the thin-film flip-chip LED lamp exceeds that of the conventional flip-chip LED-based lamp by ~45%.

Figure 3:
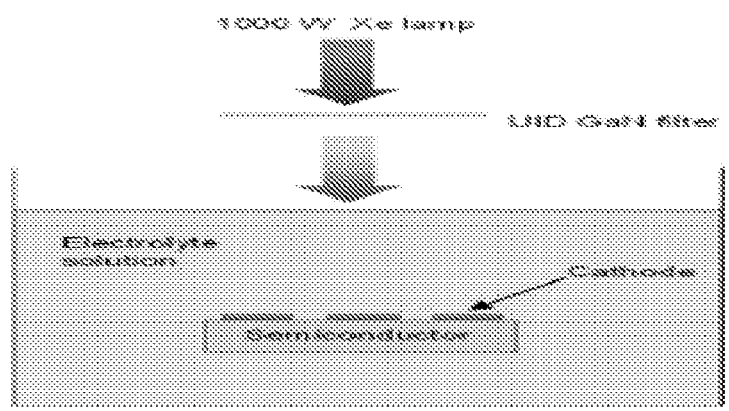
FIG. 3 is a schematic illustration of a PEC etching setup according to an embodiment of the present invention.

Photoelectrochemical (PEC) wet etching is a scalable etching method which can be applied to nitride materials and has been applied to manufacturing processes in other materials systems. In GaN-based high-brightness LED manufacturing, it is the current method of choice for inducing intentional surface roughness in high extraction-efficiency structures. PEC etching is a light-induced etching technique which uses photogenerated carriers, specifically holes, to drive the chemical reactions necessary for material removal. A PEC etching setup consists of two main components: an electrochemical cell and an above-bandgap light source. The electrochemical cell consists of a cathode (typically a thin metal film deposited on or in close proximity to the semiconductor) and an electrolyte medium. The anode in this case is the semiconductor layer or heterostructure itself. Photogenerated holes enable disassociation of the semiconductor material through the formation of an oxide which is soluble in the electrolyte, or through direct dissolution of the ionic semiconductor species. The cathode metal acts as an electron sink where excess electrons participate in the complementary reduction reactions. A schematic of a PEC etching setup is shown in FIG. 3.

A specific property of PEC etching is bandgap selectivity. Because material removal depends upon the presence of photogenerated carriers, a material that is transparent to the incident photons typically will not etch. Therefore with appropriate selection of layer composition in a semiconductor heterostructure and incident photon energies, or use of an appropriate filter between the light source and semiconductor material, layers of interest can be etched selectively. For example, a GaN filter placed between a broad-spectrum light source and an InGaN/AlGaN heterostructure may be used to limit the photogeneration of carriers (and consequent material etching) to layers in the sample structure with a bandgap energy lower than that of the filter material, i.e. to the InGaN layers.

PEC etching has the capability for vertical and lateral etching. Work out of UCSB[xv] has shown that under suitable conditions, PEC etching can yield vertical etch rates in excess of 1 µm/min and etch selectivity of 60:1 in GaN-based materials.

The following are detailed descriptions of preferred embodiments which are illustrative of the method and structure of the present invention. It should be understood that these are presented as examples only, and should not be considered as limiting the scope of this invention which would include other embodiments not shown. Of course, there are other variations, modifications, and alternatives.

Figures 4A, 4B, 4C, 4D, 4E, 4F, 4G:
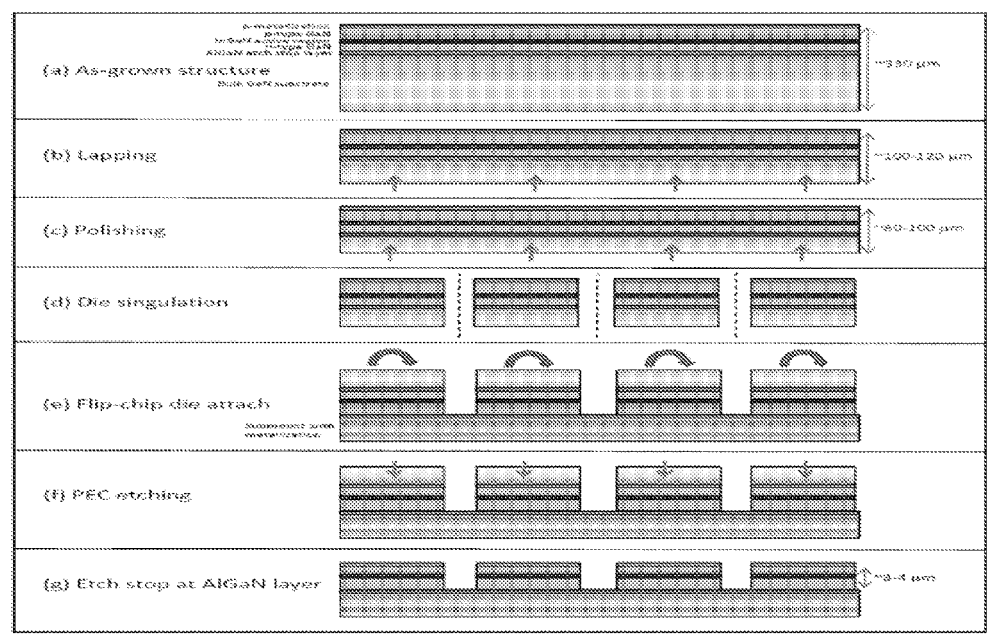
FIGS. 4(a)-4(g) are simplified process flow of a method for forming an LED device with high extraction efficiency geometry based on bulk GaN substrates, according to a specific embodiment of the present invention.

Preferred embodiment 1 as illustrated in FIGS. 4(a)-4(g) provides an effective method and structure for a plurality of LED devices on bulk GaN substrates which are configured for high-extraction efficiency. This preferred embodiment involves at least two material removal steps: one or more primary material removal steps which transition the substrate plus overlying epilayers from a first thickness to intermediate second thickness suitable for die-singulation, and following die-singulation, a separate well-controlled thinning step to result in a final thin (e.g. ~3-4 μm) epilayer. As previously discussed, in conventional heteroepitaxial devices, after substrate thinning and die-singulation the foreign substrate can be removed to result in the desired thin epilayer. In the case of bulk-GaN substrates, however, a one or more GaN thinning steps are necessary. A schematic of the process flow of preferred embodiment 1 is shown in FIG. 4(a)-4(g) and one or more elements will be subsequently described. A summary is provided below:

FIG. 4(a) is simplified diagram of a cross sectional view of multiple layers of crystalline material comprising the LED device overlying a substrate is summarized as follow: The substrate comprises bulk GaN crystalline material, with a first thickness of approximately 330 μm, but can be others, according to a specific embodiment of the present invention. The structure has a first side and a second side, the first side comprising the top layer of overlying crystalline material. An etch stop layer, for example comprising AlGaN, is included in the layer structure according to a specific embodiment of the present invention.

FIG. 4(b) is a simplified diagram of a cross-sectional view of the substrate and overlying layers of crystalline material after a first thinning step has been performed resulting in a second thickness, the second thickness being approximately 100-120 μm according to a specific embodiment of the present invention.

FIG. 4(c) is a simplified diagram of a cross-sectional view of the substrate and overlying layers of crystalline material after a second processing step (e.g. polishing) has been applied to the second side of the structure, resulting in a third thickness, the third thickness being approximately 80-100 μm according to a specific embodiment of the present invention.

FIG. 4(d) is a simplified diagram of a cross-sectional view of a plurality of LED devices, each comprising multiple layers of crystalline material overlying the bulk GaN crystalline substrate, the plurality of devices having been formed by a die-singulation technique, according to a specific embodiment of the present invention.

FIG. 4(e) is a simplified diagram of a cross-sectional view of a plurality of LED devices which have been re-oriented and attached at their first surfaces to a secondary substrate or submount, e.g. by bonding at a metallization layer, according to a specific embodiment of the present invention.

FIG. 4(f) is a simplified diagram of a cross-sectional view of a plurality of LED devices after attachment to a secondary substrate during an etching step, with arrows indicating the location of the etching at the second surfaces of each device, performed for example by photoelectrochemical (PEC) etching, according to a specific embodiment of the present invention.

FIG. 4(g) is a simplified diagram of a cross-sectional view of a plurality of LED devices attached to a secondary substrate after a selective etching step, wherein the material above the etch stop layer has been removed resulting in a fourth thickness, the fourth thickness being approximately 3-4 μm, and wherein the etch stop layer (e.g. AlGaN) remains substantially intact, according to a specific embodiment of the present invention.

As shown in FIG. 4(a)-4(g), the method of the present invention includes providing a bulk nitride containing substrate, the substrate substantially containing at least one of GaN, InN, or AlN, in a specific embodiment. In a specific embodiment, the substrate is bulk-GaN. In a specific embodiment, the substrate is bulk GaN with a c-plane crystallographic orientation. In a specific embodiment the substrate is bulk GaN with a nonpolar (e.g. a-plane or m-plane) or semipolar (e.g. (11–22) or (10–11)) crystallographic orientation.

In a preferred embodiment, the substrate provided has a thickness approximating, but not limited to, the range of 200-1000 μm. Subsequently, one or more layers are formed overlying the substrate which could comprise crystalline material, metallization layers, a combination of both, among others. According to a specific embodiment the layers of crystalline material are formed using a growth technique for nitride materials such as metal-organic chemical vapor deposition, molecular beam epitaxy, hydride vapor phase epitaxy, a combination of these, or other growth techniques. According to a preferred embodiment each of the layers of crystalline material comprise at least one of GaN, InN, or AlN, one or more layers have an epitaxial relationship with the substrate, and the combination of layers comprise an LED device. The method and structure of the present invention includes forming an etch stop layer overlying the substrate, the etch stop layer underlying the layers which comprise the LED device according to a preferred embodiment. An example of specific layers including an etch stop layer which are formed on the substrate according to a preferred embodiment of the present invention are shown in FIG. 4(a). The "In-containing active region" could comprise one or more layers of crystalline material.

In a preferred embodiment, the present invention utilizes lapping as the first step to bring the bulk-GaN substrate from a first thickness (for example in the range of ~300-400 μm) down to a second intermediate thickness (for example in the range of ~100-120 μm) as shown in FIG. 4(b). This intermediate thickness would enable die-singulation by laser scribing, diamond scribing, dicing, cleaving, breaking, a combination of these or other singulation methods. A specific embodiment includes a further polishing step resulting in a third thickness, for example in the range of 80-100 μm, which would also enable die-singulation. The die-singulation is therefore illustrated at this point in the process flow in FIG. 4(d).

Figure 1:
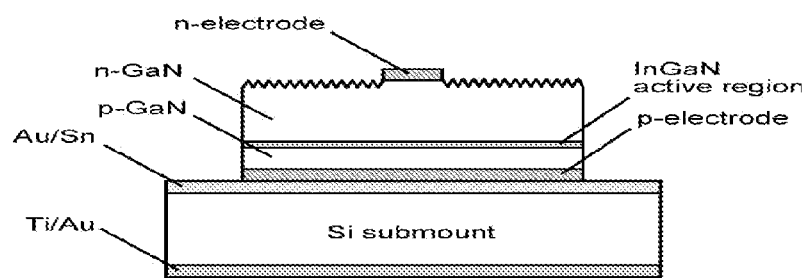
FIG. 1 is a simplified cross section of a conventional LED.

In a specific embodiment, the present invention provides for a controllable, scalable and high-yield process for a final thinning step which transitions the remaining bulk-GaN substrate to a thin membrane with a thickness of ~3-4 μm according to a specific embodiment, which is desired for high extraction efficiency. In a preferred embodiment, prior to the final thinning step, the individual LED die resulting from the singulation step will be re-oriented and die-attached to a suitable secondary substrate or submount as shown in FIG. 4(e). This would expose the lapped and polished GaN substrate surface, leaving a device configuration similar to what is shown in FIG. 1. The final thinning step will be applied to the LED die in this form factor.

As previously mentioned, in a specific embodiment, the present invention provides a device structure that includes a strategically placed etch stop layer in the MOCVD-grown epilayer structure. In a preferred embodiment this etch stop layer comprises AlGaN crystalline material, and the final thinning step is performed by photoelectrochemical (PEC) etching. As illustrated in FIG. 4(f), the PEC etching occurs to the entire plurality of LED devices which are attached to the submount and the etching occurs to the exposed substrate as indicated by the arrows. The PEC etching setup would be configured to include an AlGaN filter with a lower Al % percentage than that in the overlying LED device layers. This AlGaN filter will ensure that the carriers which drive the electrochemical etching reaction are generated in the GaN substrate layer, but not in the AlGaN layer. The AlGaN is thus unsusceptible to PEC etching, remains substantially intact, and serves as an "etch stop" layer. This type of PEC etching is known as "bandgap-selective" PEC etching. Electrolyte type, electrolyte concentration, sample electrical bias and other relevant parameters of the bandgap-selective PEC etching process can also be varied according to one or more embodiments. In a specific embodiment, the present process will be optimized for achievement of a high vertical etch rate of the GaN substrate material in conjunction with a high degree of etch selectivity between the GaN substrate and the AlGaN layer in the device structure. The vertical etching process would be complete once the GaN substrate layer has been etched through completely, exposing the AlGaN layer surface according to a specific embodiment.

In a specific embodiment, the bandgap-selective PEC etching configuration employed can induce unwanted lateral etching of other layers of the structure, for example the active region layer or layers, p-GaN and n-GaN. In a specific embodiment, the process could incorporate a mesa etch and a suitable etch-resistant conformal coating (oxide or nitride material). In such a process flow, the mesa etch is substantially vertical and performed from the side of the device with the p-GaN metallization layer and the etch stops approximately after etching through the active region layer or layers but not past the Al-containing etch stop layer. The coating would substantially cover mesa sidewalls while leaving a substantial portion of the p-GaN metallization layer on top of the mesas exposed and would protect critical layers of the LED structure from lateral PEC etching. In this process flow, the structure shown in FIG. 4(a) would include such mesas and coating layers, and be carried through the rest of the process flow with this form factor. In a specific embodiment, since the PEC etching is performed with the material attached to a secondary substrate or carrier wafer, materials for the carrier must be chosen such that any exposed material or metal trace will be etch-resistant to the etching medium.

Alternatively in a specific embodiment, to avoid unwanted lateral etching a planarization process could be added to the process flow shown in FIG. 4(a)-4(g) in between steps illustrated in FIGS. 4(e) and 4(f). Such a planarization process would include filling in the spaces between the singulated die which have been mounted to the submount with a material which is resistant to the PEC etching. A subsequent etch-back process would be utilized to result in a surface which is substantially planar across all singulated die, including spaces in between. After the PEC etching step shown in FIG. 4(f), the filler material would be removed by a method such as dissolving in a suitable solution.

In a specific embodiment, other methods besides PEC etching can be employed for the final thinning step. These methods can include but are not limited to lapping, polishing, dry etching (e.g. inductively-coupled plasma or reactive-ion etching), and dry etching with a stop etch layer (e.g. Al-containing etch stop layer). The latter case could employ the same structure containing an etch stop layer that can be used in the PEC method.

In a specific embodiment, the present invention provides a method for a comprehensive process for high extraction efficiency light-emitting structures on bulk-GaN. In one or more embodiments, the present method and resulting device provides a bandgap-selective photoelectrochemical (PEC) etching of nonpolar and semipolar bulk-GaN to achieve thin-film devices which are advantageous for light extraction. In one or more embodiments, lapping and polishing techniques will also need to be applied to bulk-GaN in order to thin the substrates prior to die-singulation. Of course, there can be other variations, modifications, and alternatives.

In a second preferred embodiment, a method of LED manufacturing which enables the substrate to be reused for epitaxial growth is provided. In one or more embodiments, a process is described utilizing PEC etching which enables the regeneration and re-use of the substrate. Conceivably, re-use or multiple uses of the same substrate would be possible after appropriate re-finishing in one or more embodiments. The method of the present invention includes providing a bulk nitride containing substrate, the substrate substantially containing at least one of GaN, InN, or AlN, in a specific embodiment. In a specific embodiment, the substrate is bulk-GaN. In a specific embodiment, the substrate is bulk GaN with a c-plane crystallographic orientation. In a specific embodiment the substrate is bulk GaN with a nonpolar (e.g. a-plane or m-plane) or semipolar (e.g. (11–22) or (10–11)) crystallographic orientation In this preferred embodiment, the present method and device could be achieved through one or more modifications of the process flow previously described. In particular, a bandgap-selective lateral PEC etch would be included according to a specific embodiment. In such a process flow, PEC etch conditions providing a high lateral etch rate and a high degree of selectivity between materials with different bandgaps would be used. According to a specific embodiment, the materials of choice are InGaN and GaN, wherein a sacrificial InGaN layer is included in the structure and is preferentially etched under suitable conditions. In such a process flow, complete lateral PEC etching of the InGaN layer would result in detachment of singulated devices from a bulk-GaN substrate without requiring singulation of the substrate.

Figures 5A, 5B, 5C, 5D, 5E, 5F:
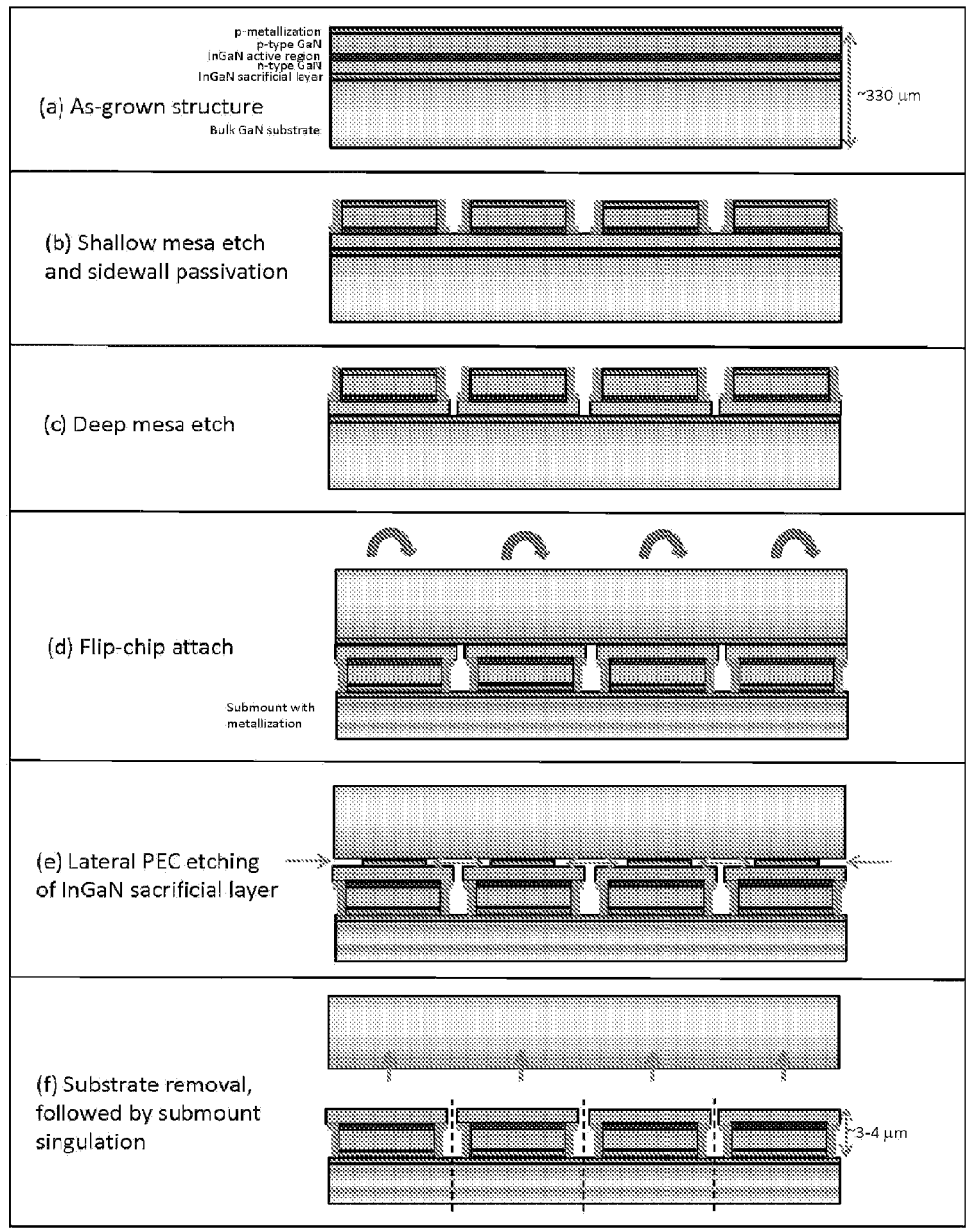
FIG. 5(a)-5(f) are simplified diagrams illustrating a method and process flow for the formation of LED devices with high extraction efficiency geometry based on bulk GaN substrates, according to another specific embodiment of the present invention.

A schematic of a process flow representative of the second preferred embodiment just described is shown in FIG. 5(a)-5(f), which is summarized as follow:

FIG. 5(a) is a simplified diagram of the cross-sectional view of multiple layers of crystalline material comprising an LED device overlying a substrate comprising bulk GaN crystalline material, with a first thickness of approximately 330 µm, but can be others, according to a specific embodiment of the present invention. The structure has a first side and a second side, the first side comprising the top layer of overlying crystalline material. A sacrificial layer, for example comprising InGaN, is included in the layer structure according to a specific embodiment of the present invention.

FIG. 5(b) is a simplified diagram of a cross-sectional view of the substrate and overlying layers of crystalline material after one or more processing steps have been performed, including a first shallow etch partially through the overlying layers resulting in a plurality of shallow mesas, and formation of an encapsulant or passivation layer over the exposed sidewalls of each mesa, according to a specific embodiment of the present invention.

FIG. 5(c) is a simplified diagram of a cross-sectional view of the substrate and overlying shallow mesa structures after a second deeper etch through the remaining overlying layers and stopping at the sacrificial layer has been performed, resulting in deep mesa structures, according to a specific embodiment of the present invention.

FIG. 5(d) is a simplified diagram of a cross-sectional view of the substrate and overlying deep mesa structures which has been re-oriented and attached to a secondary substrate or submount, e.g. by bonding at a metallization layer, and exposing the second surface, according to a specific embodiment of the present invention.

FIG. 5(e) is a simplified diagram of a cross-sectional view of the substrate and overlying deep mesa structures attached to a secondary substrate which are subjected to a lateral selective etch, which is allowed to proceed where indicated with arrows, wherein the sacrificial layer (e.g. InGaN) is selectively etched, according to a specific embodiment of the present invention.

FIG. 5(f) is a simplified diagram of a cross-sectional view of the separation of the substrate from the deep mesa structures and secondary substrate which occurs when the sacrificial layer is completely removed by selective etching, according to a specific embodiment of the present invention. Dashed lines indicate where further separation can occur, e.g. by die-singulation, to form plurality of LED devices which are attached to the underlying portion of the secondary substrate.

In a specific embodiment, a substrate removal process which permits the regeneration and re-use of substrates would commence forming a p-metallization layer on top of the as-grown structure as shown in FIG. 5(a). According to the preferred embodiment shown, an InGaN sacrificial layer is included in the structure below the n-type GaN layer. In this preferred embodiment, two conventional dry etches would be performed, for example by reactive-ion etching (RIE) or inductively-coupled plasma (ICP) etching, as shown in FIGS. 5(b) and 5(c). In a specific embodiment the first etch is substantially vertical and performed from the side of the device with the p-GaN metallization layer, and results in a shallow mesa which ends approximately after etching through the active region layer or layers but not past the In-containing sacrificial layer. Following the first etch, as shown in FIG. 5(b), a passivation or encapsulant layer is formed over the sidewalls of the shallow mesa, for example comprising a dielectric such as an oxide or nitride layer. In a specific embodiment the second etch is substantially vertical and results in a mesa which ends approximately at the sacrificial layer and exposes any portion of the sacrificial layer (FIG. 5(c)). These two vertical etches enable protection of the In-containing active region using sidewall passivation, and also expose the In-containing sacrificial layer to enable etching solution access during lateral PEC etching, as depicted in FIG. 5(e).

After the etching steps and passivation, the substrate and overlying layers are then re-oriented and attached to a secondary substrate or carrier wafer herein referred to as a submount. In a preferred embodiment the re-orientation of the substrate and overlying layers is by 180 degrees resulting in attachment (e.g., metal bond) to the submount at the p-GaN side of the structure (FIG. 5(d)). This is followed by the selective etching step, which in a specific embodiment is done using PEC etching with conditions suitable for rapid lateral etching of the In-containing sacrificial layer (FIG. 5(e)). Complete etching of the sacrificial layer enables individual die to be undercut, eventually resulting in the separation of individual die from the substrate in a "lift-off" process (FIG. 5(f)). Once the die are separated from the original substrate, the device processing may be continued in any of a number of ways. The detached substrate may then be regenerated using one or a combination of chemical-mechanical surface treatments commonly known in the art, in order to enable re-use for epitaxy. It is conceivable that each substrate may thus be regenerated and re-used multiple times, with the number of uses being determined, among other factors, by the thickness of material removed during the regeneration process.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

APPENDIX A

Bibliography of References Cited

1. H. Sato, R. B. Chung, H. Hirasawa, N. Fellows, H. Masui, F. Wu, M. Saito, K. Fujito, J. S. Speck, S. P. DenBaars, and S. Nakamura, "Optical properties of yellow light-emitting diodes grown on semipolar (1122) bulk GaN substrates," Applied Physics Letters 92, 221110 (2008).
2. K. Iso, H. Yamada, H. Hirasawa, N. Fellows, M. Saito, K. Fujito, S. P. DenBaars, J. S. Speck, and S. Nakamura, "High brightness blue InGaN/GaN light emitting diode on nonpolar m-plane bulk GaN substrate", Japanese Journal of Applied Physics 46, L960 (2007).
3. M. C. Schmidt, K.-C. Kim, H. Sato, N. Fellows, H. Masui, S. Nakamura, S. P. DenBaars, and J. S. Speck, "High power and high external efficiency m-plane InGaN light emitting diodes", Japanese Journal of Applied Physics 46, L126 (2007).
4. A. Tyagi, H. Zhong, N. Fellows, M. Iza, J. S. Speck, S. P. DenBaars, and S. Nakamura, "High brightness violet InGaN/GaN light emitting diodes on semipolar (1011) bulk GaN substrates", Japanese Journal of Applied Physics 46, L129 (2007).
5. H. Zhong, A. Tyagi, N. Fellows, F. Wu, R. B. Chung, M. Saito, K. Fujito, J. S. Speck, S. P. DenBaars, and S. Nakamura, "High power and high efficiency blue light emitting diode on freestanding semipolar (1011) bulk GaN substrate", Applied Physics Letters 90, 233504 (2007).
6. H. Sato, A. Tyagi, H. Zhong, N. Fellows, R. B. Chung, M. Saito, K. Fujito, J. S. Speck, S. P. DenBaars, and S. Nakamura, "High power and high efficiency green light emitting diode on free-standing semipolar (1122) bulk GaN substrate", Physical Status Solidi—Rapid Research Letters 1, 162 (2007).
7. T. Fujii, Y. Gao, R. Sharma, E. L. Hu, S. P. DenBaars, and S. Nakamura, "Increase in the extraction efficiency of GaN-based light-emitting diodes via surface roughening", Applied Physics Letters 84, 855 (2004).
8. J. J. Wierer, D. A. Steigerwald, M. R. Krames, J. J. O'Shea, M. J. Ludowise, G. Christenson, Y.-C. Shen, C. Lowery, P. S. Martin, S. Subramanya, W. Gotz, N. F. Gardner, R. S. Kern, and S. A. Stockman, "High-power AlGaInN flip-chip light-emitting diodes", Applied Physics Letters 78, 3379 (2001).
9. O. B. Shchekin, J. E. Elper, T. A. Trottier, T. Margalith, D. A. Steigerwald, M. O. Holcomb, P. S. Martin, and M. R. Krames, "High performance thin-film flip-chip InGaN-GaN light-emitting diodes", Applied Physics Letters 89, 071109 (2006).
10. A. Tamboli, M. C. Schmidt, S. Rajan, U. K. Mishra, S. Nakamura, and E. Hu, "Photoelectrochemical etching for nonpolar devices", oral presentation at International Workshop on Nitride Semiconductors (IWN) 2008, Montreux, Switzerland.
11. A. D. Little, "Energy Savings Potential of SSL" Report for the Department of Energy, http://www.eere.energy.gov/building s/info/documents/pdfs/ssl_final_report3.pdf.
12. Sources: Strategies Unlimited, Optoelectronics Industry Development Association (OIDA), and Yole Developpement
13. The Solid State Lighting and Energy Center (SSLEC) was founded in March 2007, and is the successor to the Solid State Lighting and Display Center (SSLDC) at UCSB.

What is claimed is:

1. A method for fabricating a plurality of light emitting diodes (LEDs) comprising:

providing a non-polar or semi-polar bulk crystalline substrate which includes gallium nitride, and which has a front surface and a back surface separated by a first thickness;

forming a precursor structure for the LEDs on the substrate by forming an AlGaN filter layer with a lower Al % percentage than that in the overlying layers over the front surface, an n-type layer over the filter layer, an active region layer over the n-type layer, a p-type layer over the active region layer, and a metallization layer over the p-type layer;

removing material from the back surface of the substrate to reduce the substrate to a second thickness;

dividing the substrate and overlying layers into separate LED devices;

mounting the LED devices to a carrier structure having an upper surface with the metallization layer on each LED device in contact with the carrier structure; and etching, using bandgap-selective photoelectrochemical etching, the substrate to a thickness of 3-4 μm.

2. The method of claim 1 wherein the step of dividing the substrate comprises at least one of scribing, dicing, cleaving, and breaking.

3. The method of claim 1 wherein the step of mounting the LED devices to a carrier structure comprises eutectic bonding.

4. The method of claim 1 wherein the n-type layer and the p-type layer each comprise GaN.

5. The method of claim 4 wherein the active region layer comprises InGaN.

6. The method of claim 5 wherein after the step of mounting the LED devices to a carrier a step is performed of depositing filler material at least between the LEDs.

7. The method of claim 6 further comprising removing the filler material after the step removing the substrate down to a thickness of 3-4 μm.

8. A method for fabricating a plurality light emitting diodes (LEDs) comprising:

providing a gallium nitride substrate with a non-polar or semi-polar crystallographic orientation, the substrate having a front surface and a back surface separated by a first thickness;

forming a precursor structure for the LEDs on the substrate by forming an sacrificial layer over the surface region, an n-type layer over the sacrificial layer, an active region over the n-type layer, a p-type layer over the active region, and a metallization layer over the p-type layer;

dividing the precursor structure into separate LEDs by etching channels in the structure which extend through the metallization layer, the p-type layer, the active region, and the n-type layer, to the sacrificial layer;

attaching a submount to the metallization layer on the precursor structure;

laterally etching the sacrificial layer to enable removal of the substrate;

removing the substrate, and dividing the submount and overlying layers into separate LED devices wherein the step of dividing the precursor structure into separate LEDs by etching channels in the structure further comprises:

in a first etching step etching the metallization layer, the p-type layer, and the active region to thereby form mesa structures having sidewalls; and in a second etching step etching the n-type layer.

9. The method of claim 8 further comprising a step of passivating the sidewalls of the mesa structures before performing the second etching step.

10. The method of claim 9 wherein the step of passivating the sidewalls comprises oxidizing the sidewalls.

11. The method of claim 8 wherein the step of laterally etching the sacrificial layer comprises performing a photoelectrochemical etching process.

12. The method of claim 8 further comprising after the step of removing the substrate, the substrate which has been removed is reused in the step of providing a gallium nitride substrate with a non-polar or semi-polar crystallographic orientation.

13. The method of claim 8 wherein the sacrificial layer comprises indium gallium.

14. The method of claim 13 wherein the sacrificial layer comprises InGaN.

15. The method of claim 8 wherein the substrate has a first band gap energy and the sacrificial layer has a second band gap energy less than the first band gap energy.

16. The method of claim 8 wherein the step of laterally etching the sacrificial layer to enable removal of the substrate comprises performing a photoelectrochemical etching process.

17. The method of claim 8 wherein the n-type layer and the p-type layer each comprise GaN.

18. The method of claim 17 wherein the active layer comprises InGaN.

* * * * *